United States Patent [19]

Hoffmann

[11] 4,440,823
[45] Apr. 3, 1984

[54] PRINTED BOARD FOR ELECTRICAL CIRCUITS

[75] Inventor: Horst Hoffmann, Höhenkirchen, Fed. Rep. of Germany

[73] Assignee: Wilhelm Ruf KG, Munich, Fed. Rep. of Germany

[21] Appl. No.: 386,254

[22] Filed: Jun. 8, 1982

Related U.S. Application Data

[62] Division of Ser. No. 246,153, Mar. 23, 1981, abandoned.

[30] Foreign Application Priority Data

Apr. 9, 1980 [DE] Fed. Rep. of Germany ....... 3013667

[51] Int. Cl.³ .......................... B32B 3/00; B32B 7/00; C23F 1/02; B44C 1/22
[52] U.S. Cl. .................. 428/209; 156/659.1; 156/902; 156/904; 174/68.5; 427/96; 428/601; 428/901
[58] Field of Search ...................... 156/659.1, 901, 902, 156/904; 174/68.5; 428/156, 195, 209, 601, 901, 551, 553; 427/205, 96

[56] References Cited

U.S. PATENT DOCUMENTS 3,998,677 12/1976 Anderson et al. ............... 156/659.1

FOREIGN PATENT DOCUMENTS 2059425 6/1970 Fed. Rep. of Germany .
2815982 10/1979 Fed. Rep. of Germany .
2007029 5/1979 United Kingdom .

*Primary Examiner*—William A. Powell
*Attorney, Agent, or Firm*—Armstrong, Nikaido, Marmelstein & Kubovcik

[57] ABSTRACT

A process for producing printed boards for electrical circuits in the case of which copper-coated board material is printed with an etch resist or etch resistant lacquer is representative of printed wiring to be produced, and after the curing of the etch resist, the copper layer is etched away at positions where it is not resist-covered. The etch resist is electrically conducting.

In a further development of the invention non-conducting etch resist is used for making crossovers of the printed wiring of a multi-layer printed board.

1 Claim, 3 Drawing Figures

PRINTED BOARD FOR ELECTRICAL CIRCUITS

This is a division, of application Ser. No. 246,153, filed Mar. 23, 1981, now abandoned.

BACKGROUND OF THE INVENTION

The present invention is with respect to a printed board for electrical circuits and to a process for making it. The present invention is more specially in connection with a printed board made up of a board material covered with a copper layer in the form of printed wiring and a process for making printed boards in the case of which after coating the copper coated boards with etch resist in the form of desired wiring the etch resist is cured and the copper layer not covered by the etch resist is etched away.

Such printed boards for electrical circuits and such processes for making such boards have come into general use. The starting material is normally copper coated board, made for example of paper-resin laminate. By screen printing or spraying, for example, a pattern of etch resist is produced on the copper layer to take the form of the desired printed wiring. Furthermore photographic processes may be used, in which the copper layer is completely covered by the etch resist. In this case the etch resist is photosensitive and, after exposure through a mask representative of the printed wiring, undergoes development, the etch resist being then washed away at those positions at which the copper is then later to be etched.

Furthermore it is old for an uncoated, that is to say not copper coated board, to have electrically conducting lacquer, that is to say "resistance lacquer conducting lacquer" put on it by screen printing or some other process. Such lacquers as presently marketed however have the shortcoming that copper coated therewith may not be soldered so that for producing the printed circuit boards, which are then later to have the electrical components fixed to them, such a process may not be used, although however the components may be riveted in place, but this is a high-price operation. A further shortcoming of conducting lacquer is to be seen in its relatively high resistivity in comparison with copper printed wiring.

In the case of the copper coated boards with printed wiring noted earlier there is on the other hand the shortcoming that after etching, the etch resist has to be taken off again for uncovering the printed wiring for soldering. Furthermore the copper layer, once freed of the etch resist, is oxidized relatively quickly so that such oxide has to be cleaned off from the copper before any soldering.

For many uses it is best for certain switching functions to be undertaken on the printed board itself, for example by having an electrically conducting current which is able to be moved into and out of contact with a certain point on the printed wiring or, in other cases, ane part of the printed wiring may be joined up with other printed wiring near to it by moving electric contact. Because copper is quickly oxidized, the printed wiring has to be coated, at least at the contact points, with non-oxidizing electrically conducting material as for example gold, silver or nickel by electroplating, this making it necessary for the structure to be plated to be in one piece electrically, this not being true of most printed circuit structures. If, for keeping prices low, the contact coating material, as for example gold, is to be limited to the contact points only, in a separate working step certain parts of the printed wiring have to covered over or masked with a material which is resistant to the electroplating bath, this making further working steps necessary together with specially produced masks.

SHORT OVERVIEW OF THE INVENTION

One purpose of the present invention is that of making such a development of the process as noted at the start that, with a decrease in the price of the process for making printed boards, and making the process simpler, a low electrical resistance of the printed wiring and troublefree operation of the switching contact points may be made certain of. Furthermore a circuit board in line with these needs is to be designed.

This purpose and further purposes are effected by the present invention in that the etch resist is electrically conducting. A useful effect is produced if a resistance lacquer or a conducting lacquer is used as an etch resist, which is kept on the top face of the copper wire on the board as a permanent covering. Because the electrically conducting lacquer is parallel to the copper printed wiring, the electrical resistance of the printed wiring generally will be greatly decreased. An important useful effect of the electrically conducting lacquer is that it is not oxidized, or only oxidized to a low degree, so that it may be used without any further measures such as electroplating with noble metals, even at the switching contact points. Furthermore there is the useful effect in comparison with the known process that there are no longer the working steps of taking off the etch resist and cleaning oxide from the uncovered printed wiring. In a further development of the process the printed wiring produced on a copper coated board and made up of resistant lacquer firstly undergoes physical drying and then the etching operation takes place, the last working step being that of complete curing by heating, that is to say polymerization, of the resistance and/or insulating layers.

If the electric or electronic components are to be soldered onto the circuit boards, as part of a useful further development of the invention, at the points of soldering or lands of the printed wiring a readily soluble etch resist is coated onto the copper coated board in place of the electrically conducting lacquer. This is undertaken in a separate working step. By taking off this etch resist, the readily soldered copper layer is uncovered. The combination of these two printing operations is repsonsible for the further useful effect that on designing the layout for these two printing operations in a desired way, the soldering resist printing operation, which is frequently necessary, will not be needed.

A further useful effect of the invention is that it may be used for producing multi-layer printed boards in which at the crossover points of the printed wiring, after producing the first printed wiring layer, insulating lacquer is placed and then resistance lacquer is placed thereon in the form of printed wiring bridges. In this respect, as part of the invention, the printed wiring of all layers or planes, but for the crossover points, is coated in a first step with an electrically conducting etch resist. In this case as well it is naturally possible, as we have seen, for soldering points or lands to be produced.

A circuit board produced in the process of the invention will so be seen to have an electrically conducting layer of lacquer over the copper printed wiring, this offering the useful effect that the electrical resistance of the printed wiring is greatly decreased by the putting in parallel of the copper layers and the layer of electrically conducting lacquer and that no further measures have to be taken for producing switching contact points.

LIST OF FIGURES

An account will now be given of the invention using two working examples in connection with the figures, in more detail.

DETAILED ACCOUNT OF WORKING EXAMPLES OF THE INVENTION

In the separate figures parts having the same function are marked with the same part numbers.

Figure 1:
FIG. 1 is a side view of a circuit board as produced in the present invention.

In the first working example of FIG. 1 a circuit board is made up of the board 1 of electrically insulating material as for example resin-paper laminate, coated with a copper layer 2 and those positions where printed wiring is to be produced, a layer of electrically conducting etch resist or etch resistant lacquer 3 is put on, for example by screen printing. The steps of the process are: Firstly on the board 1 coated with copper layer 2 a layer of electrically conducting etch resist 3 is placed representative of the desired printed wiring to be produced and, after resist 3 has been dried, the copper layer 2, not covered by resist 3 is etched away in an etching bath so that only the copper covered by the resist 3 will be present on the board 1. Then the resist 3 is completely cured, that is to say polymerized, by heating.

Figure 2:
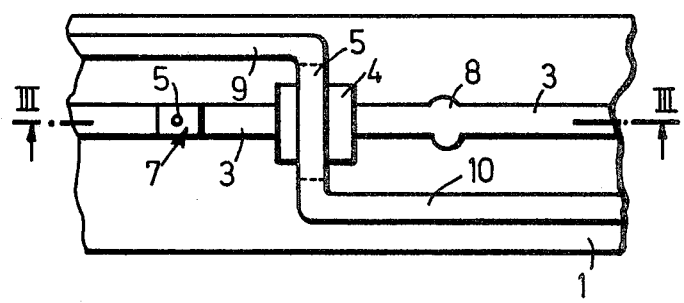
FIG. 2 is a plan view of a circuit board with a crossover point.
Figure 3:
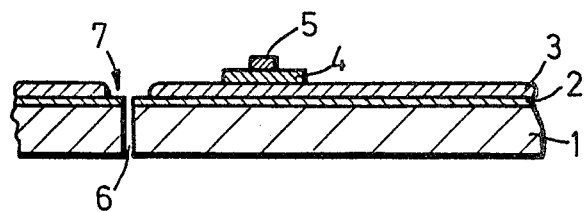
FIG. 3 is a section on the line III—III of FIG. 2.

In FIGS. 2 and 3 a crossover point, a land or blivet and a contact point are to be seen diagrammatically. On the board 1, coated with copper layer 2, in a first working step the electrically conducting etch resist or etch resistant lacquer is put on at the positions where the desired printed wiring 3, 9 and 10 is to be produced, printed wiring 3 having a contact or switching point 8 in the form of a somewhat broader part of the wire. A soldering land 7 and a part of the printed wire 5 at the crossover point are not, in this working step, coated with resist or lacquer.

If a soldering point, normally having a hole 6, is to be produced, after a drying operation and in a second working step an electrically insulating etch resist is put on at this position.

In a third step the copper layer 2, not covered by etch resist, is etched away.

In a fourth step at the crossover point an electrically insulating layer 4 is put on by screen printing or otherwise, and dried.

In a fifth step the bridge part of the crossover is put on as electrically conducting lacquer 5, for example by screen printing, there being overlap between layers 5 and 9, and, on the other hand, 5 and 10 so that a high quality electrical connection between layers 9 and 10 comes into being. Then complete curing may take place, that is to say polymerization of the resistance and/or insulating layers.

If a soldering point is to be produced, unconducting etch resist is cleaned from point 7 so that this point is got ready for later soldering and, if necessary, it will have any oxide on it cleaned off.

All measures and useful effects of the invention to be seen in the specification, claims and the figures, together with details of design and of configuration may be important for the invention separately or in any desired combination.

I claim:

1. A printed circuit board for an electrical circuit, said printed circuit board comprising:
   (a) an insulating board;
   (b) a copper layer on said insulating board; and
   (c) an etch resistant, electrically conducting lacquer layer covering said copper layer is protected from oxidation by said electrically conducting lacquer layer and its conductivity is enhanced.

* * * * *

UNITED STATES PATENT AND TRADEMARK OFFICE
CERTIFICATE OF CORRECTION

PATENT NO. : 4,440,823
DATED : April 3, 1984
INVENTOR(S) : HORST HOFFMANN

It is certified that error appears in the above-identified patent and that said Letters Patent is hereby corrected as shown below:

Column 1, line 56, "current" should be --- contact ---.

Column 1, line 59, "ane" should be --- one ---.

Column 2, line 2, after "to" insert --- be ---.

Column 4, line 37, after "layer" (second occurrence) insert --- in a predetermined pattern whereby said copper layer ---.

Signed and Sealed this

Twenty-fifth Day of December 1984

[SEAL]

Attest:

Attesting Officer

GERALD J. MOSSINGHOFF

Commissioner of Patents and Trademarks